(12) United States Patent
Wada et al.

(10) Patent No.: US 11,673,741 B2
(45) Date of Patent: Jun. 13, 2023

(54) STORAGE SYSTEM

(71) Applicant: Murata Machinery, Ltd., Kyoto (JP)

(72) Inventors: Eiji Wada, Inuyama (JP); Kosuke Irino, Inuyama (JP); Yoshiki Yuasa, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 98 days.

(21) Appl. No.: 17/425,364

(22) PCT Filed: Dec. 13, 2019

(86) PCT No.: PCT/JP2019/048871
§ 371 (c)(1),
(2) Date: Jul. 23, 2021

(87) PCT Pub. No.: WO2020/153040
PCT Pub. Date: Jul. 30, 2020

(65) Prior Publication Data
US 2022/0097965 A1 Mar. 31, 2022

(30) Foreign Application Priority Data

Jan. 25, 2019 (JP) .............................. JP2019-011281

(51) Int. Cl.
*B65G 1/04* (2006.01)
*B61B 3/02* (2006.01)
(Continued)

(52) U.S. Cl.
CPC .............. *B65G 1/0457* (2013.01); *B61B 3/02* (2013.01); *E04B 9/006* (2013.01); *H01L 21/67733* (2013.01); *B65G 2201/0297* (2013.01)

(58) Field of Classification Search
CPC .......... B65G 1/0457; B65G 2201/0297; B61B 3/02; E04B 9/006; H01L 21/67733; H01L 21/6773; H01L 21/67736; H01L 21/67724
See application file for complete search history.

(56) References Cited

U.S. PATENT DOCUMENTS

| 9,187,260 B2 | 11/2015 | Ota et al. |
| 9,415,934 B2 * | 8/2016 | Ikeda ...................... B66C 19/00 |

(Continued)

FOREIGN PATENT DOCUMENTS

| CN | 106458443 A | 2/2017 |
| JP | 2000-124284 A | 4/2000 |

(Continued)

OTHER PUBLICATIONS

Extended European Search Report dated Aug. 29, 2022, of counterpart European Patent Application No. 19911175.8.

(Continued)

*Primary Examiner* — Glenn F Myers
(74) *Attorney, Agent, or Firm* — DLA Piper LLP (US)

(57) ABSTRACT

A storage system prevents a large load from being applied to a part of the ceiling. The storage system in which a rack is provided by being suspended from a first position of a ceiling by a first suspending member attached to a grid ceiling, a second overhead track is provided by being suspended from a second position of the grid ceiling by a second suspending member attached to the grid ceiling, and the first position and the second position are set to be apart by at least a predetermined distance.

7 Claims, 9 Drawing Sheets

(51) Int. Cl.
    *E04B 9/00*          (2006.01)
    *H01L 21/677*      (2006.01)

(56) References Cited

U.S. PATENT DOCUMENTS

| | | | |
|---|---|---|---|
| 9,548,230 B2 * | 1/2017 | Iwasaki | H01L 21/6773 |
| 2008/0014061 A1 | 1/2008 | Izumi | |
| 2015/0329298 A1 | 11/2015 | Ito et al. | |
| 2017/0140966 A1 | 5/2017 | Li et al. | |
| 2017/0200626 A1 * | 7/2017 | Takai | H01L 21/67769 |
| 2019/0006217 A1 | 1/2019 | Motoori | |

FOREIGN PATENT DOCUMENTS

| | | |
|---|---|---|
| JP | 2007-331906 A | 12/2007 |
| JP | 2017-030944 A | 2/2017 |
| TW | 201704120 A | 2/2017 |
| WO | 2012/060291 A1 | 5/2012 |
| WO | 2017/029871 A1 | 2/2017 |
| WO | 2018/074130 A1 | 4/2018 |
| WO | 2019/003753 A1 | 1/2019 |
| WO | 2019/003799 A1 | 1/2019 |

OTHER PUBLICATIONS

First Office Action dated Jun. 30, 2022, of counterpart Chinese Patent Application No. 201980090003.X, along with an English translation.

* cited by examiner

SYS

STORAGE SYSTEM

TECHNICAL FIELD

This disclosure relates to a storage system.

BACKGROUND

At semiconductor manufacturing plants and the like, articles such as front-opening unified pod (FOUP) that accommodates semiconductor wafers or a reticle pod that contains a reticle are transported by an overhead transport vehicle, and the delivery and reception of articles to and from a transfer destination such as a load port of processing equipment is performed. It has been known that the articles transported by this overhead transport vehicle are stored in a storage system capable of delivering and receiving the articles to and from the overhead transport vehicle (for example, Japanese Unexamined Patent Application Publication No. 2017-30944). In JP '944, a rack including a plurality of storages arranged vertically, on which articles are placed, is provided, and this rack is arranged by being suspended from the ceiling.

In a building where the storage system described in JP '944 is provided, another overhead transport vehicle system may be provided, for example. When the position where an overhead track of the other overhead transport vehicle system is suspended from the ceiling and the position where the rack is suspended are close to each other, a load on a part of the ceiling may be increased and a withstanding load may be exceeded at a part of the ceiling. Thus, large-scale additional work such as reinforcement of the ceiling or changing the suspending position by a beam and the like is needed, which leads to an increase in installation cost.

It could therefore be helpful to provide a storage system that prevents an enlarged load from being applied to a part of the ceiling.

SUMMARY

We thus provide:

A storage system may include an overhead stocker including a first overhead track, a rack including a plurality of storages arranged vertically, and a crane that travels along the first overhead track and delivers and receives an article to and from the storages; and an overhead transport vehicle system including a second overhead track provided below a lower end of the overhead stocker, and an overhead transport vehicle that travels along the second overhead track and delivers and receives an article to and from a predetermined transfer destination; wherein the rack is provided by being suspended from a first position of the ceiling by a first suspending member attached to the ceiling, the second overhead track is provided by being suspended from a second position of the ceiling by a second suspending member attached to the ceiling, and the first position and the second position are set to be apart by at least a predetermined distance.

The predetermined distance may be a distance that is set so that magnitude of a load per unit area in the ceiling does not exceed a predetermined value. The ceiling may be a grid ceiling in which a plurality of squares are in line in each of directions orthogonal in the horizontal direction, and the unit area may be an area of one square. The first position and the second position may be set to the squares different from each other in the grid ceiling. The first overhead track may be provided by being suspended from a third position of the ceiling by a third suspending member attached to the ceiling, and one of a plurality of first positions and one of a plurality of third positions may be set to one square in the grid ceiling. A part of the first overhead track and a part of the second overhead track may be arranged in an overlapping manner in planar view. The rack may, in planar view, be provided in an area including directly above a processing apparatus that has the predetermined transfer destination.

Because the first suspending member suspending the rack and the second suspending member suspending the second overhead track are set apart by the predetermined distance, the suspending position of the rack that occupies a large proportion in the weight of the overhead stocker and the suspending position of the second overhead track that occupies a large proportion in the weight of the overhead transport vehicle system can be avoided to be close to each other, and the suspending position of the rack and the suspending position of the second overhead track can be dispersed. As a result, it is possible to avoid a large load to be applied to a part of the ceiling and, as there is no need for large-scale additional work such as reinforcement of the ceiling and the like, to prevent an increase in the installation cost.

In the configuration in which the predetermined distance is a distance that is set so that the magnitude of a load per unit area in the ceiling does not exceed a predetermined value, by using the unit area as a reference, the predetermined distance can be set easily. In the configuration in which the ceiling is a grid ceiling in which a plurality of squares are in line in each of directions orthogonal in the horizontal direction and the unit area is an area of one square, the unit area in the ceiling can be recognized easily by the square and, by referring to the squares, the predetermined distance can be set easily. In the configuration in which the first position and the second position are set to the squares different from each other in the grid ceiling, the first position and the second position can be easily set apart by the predetermined distance or more. In the configuration in which the first overhead track is provided by being suspended from a third position of the ceiling by a third suspending member attached to the ceiling and one of a plurality of first positions and one of a plurality of third positions are set to one square in the grid ceiling, by arranging the third position that is a suspending position of the first overhead track having a small proportion in the weight of the overhead stocker and the first position in the same square, the first suspending member and the third suspending member are close to each other and the workability in the installation or maintenance of these suspending members can be improved. In the configuration in which a part of the first overhead track and a part of the second overhead track are arranged in an overlapping manner, the overhead stocker and the overhead transport vehicle system can be arranged compactly in planar view. In the configuration in which the rack is, in planar view, provided in an area including directly above a processing apparatus having a predetermined transfer destination, by arranging the rack directly above the processing apparatus where the second overhead track is not arranged, the first position where the rack is suspended and the second position where the second overhead track is suspended can be easily made apart and dispersed.

DESCRIPTION OF REFERENCE SIGNS

Figure 1:
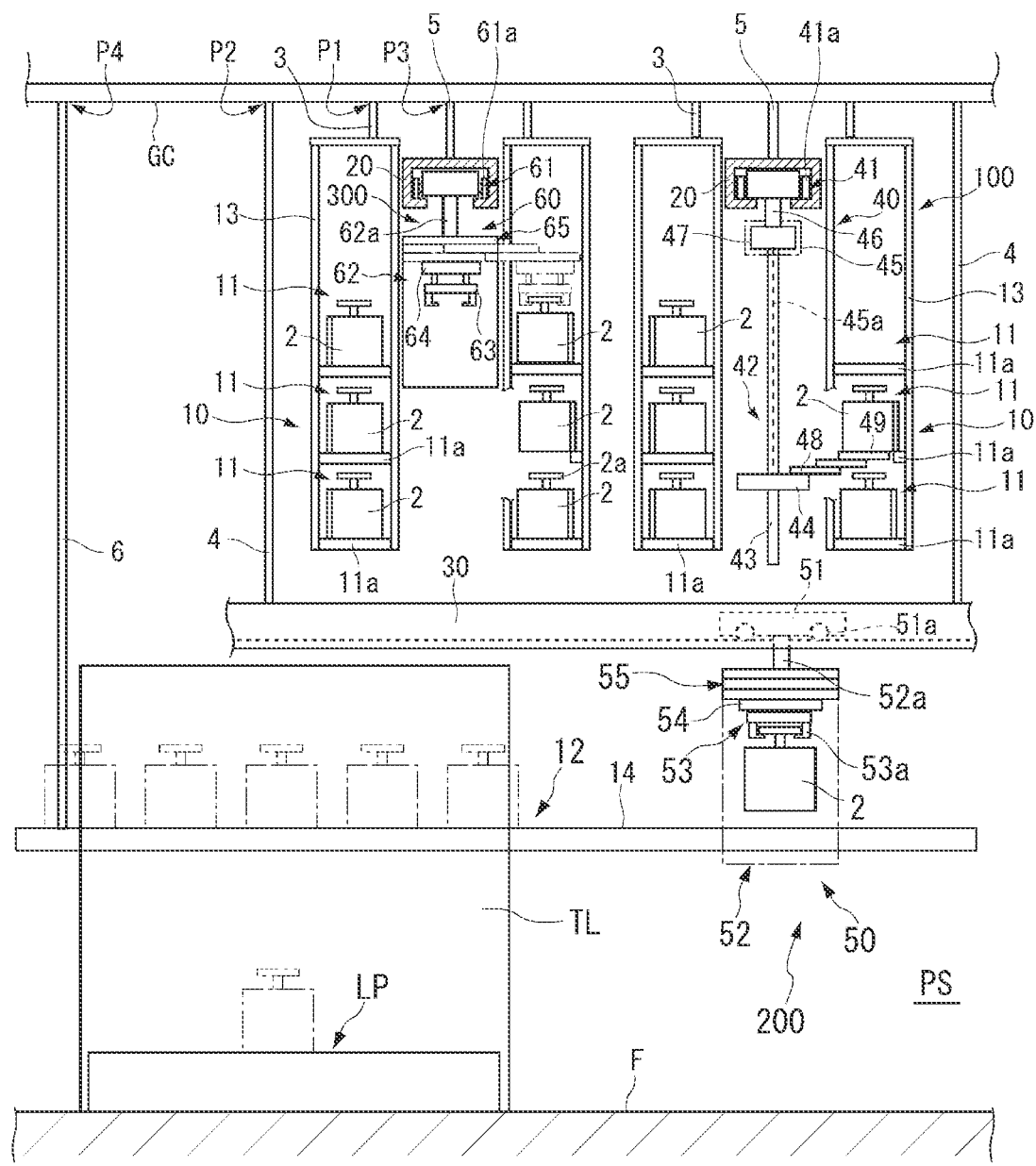
FIG. 1 is a diagram of a storage system according to an example viewed from the Y direction.

G square
GC grid ceiling
L predetermined distance
P1 first position
P2 second position
P3 third position
P4 fourth position
LP load port
TL processing apparatus
SYS storage system
2 article
3 first suspending member
4 second suspending member
5 third suspending member
6 fourth suspending member
10 rack
12 delivery/reception port
20 first overhead track
30 second overhead track
40 crane
50 overhead transport vehicle
60 upper overhead transport vehicle
70 beam portion
100 overhead stocker
200 overhead transport vehicle system
300 transport device

DETAILED DESCRIPTION

The following describes an example with reference to the accompanying drawings. However, our storage systems are not limited to the example described in the following. In addition, to explain the example, the drawings are expressed by changing the scale as appropriate such as drawing a part in a large or emphasized manner. In each of the following drawings, the directions in the drawing will be described using an XYZ coordinate system. In this XYZ coordinate system, the vertical direction is the Z direction, and the horizontal direction is the X direction and the Y direction. The Y direction is one direction within the horizontal direction and is a traveling direction of a crane 40, an overhead transport vehicle 50, and an upper overhead transport vehicle 60 which will be described later. The X direction is the direction orthogonal to the Y direction. In each direction of the X, Y, and Z directions, a direction pointed by an arrow is expressed as a positive direction (for example, +X direction) and the direction opposite to the direction pointed by the arrow is expressed as a negative direction (for example, −X direction), as appropriate.

Figure 2:
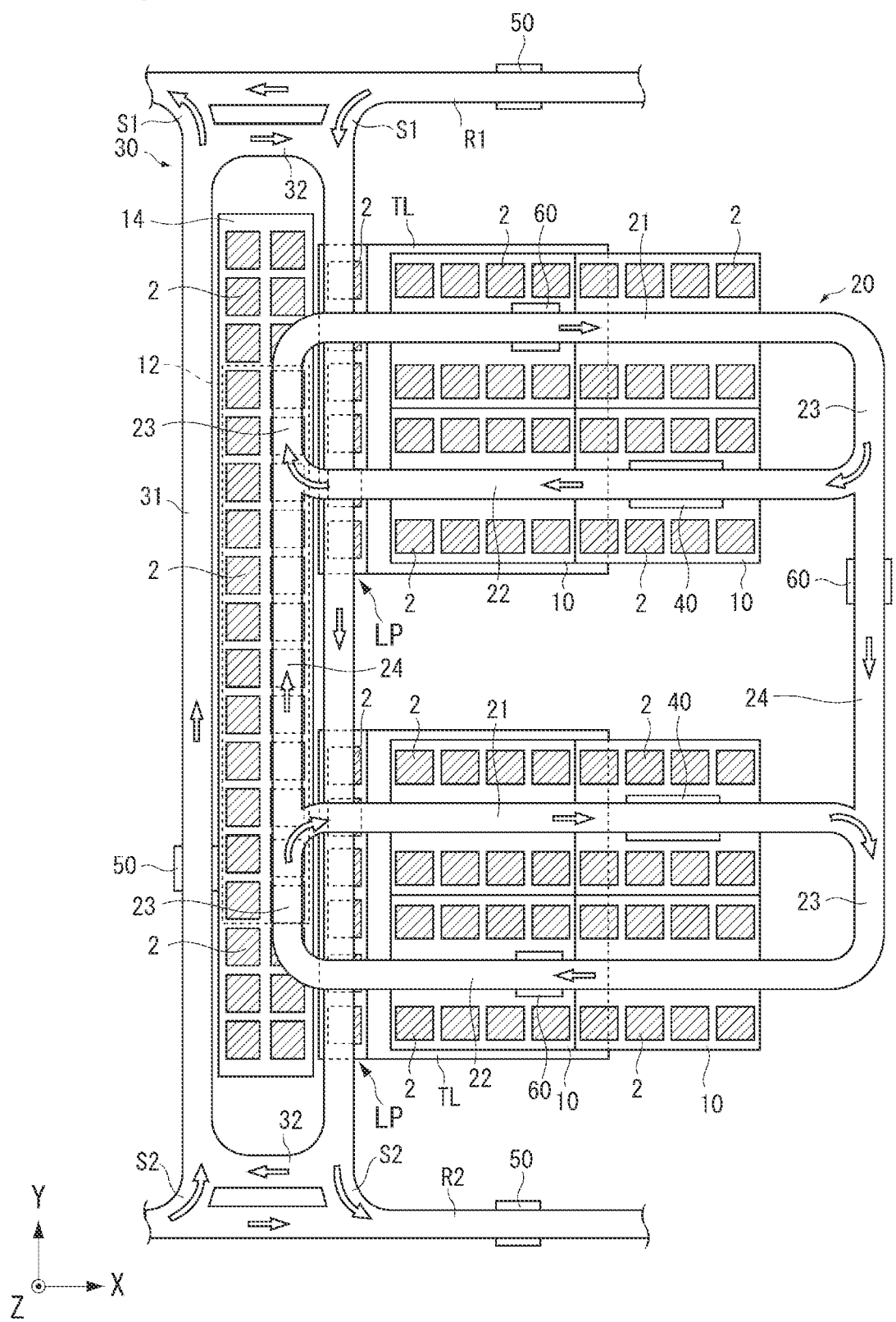
FIG. 2 is a diagram schematically illustrating the storage system in planar view.

FIG. 1 is a diagram of a storage system SYS according to an example viewed from the Y direction. FIG. 2 is a diagram schematically illustrating the storage system SYS in planar view. In FIG. 2, to facilitate making distinctions in the drawing, articles 2 are indicated by hatching.

The storage system SYS illustrated in FIGS. 1 and 2 are provided, for example, in a semiconductor device manufacturing factory and the like and stores the articles 2 such as FOUPs that accommodate semiconductor wafers used for manufacturing semiconductor devices or reticle pods that contain reticles. In the first example, an example in which the article 2 is a FOUP will be described, but the article 2 may be other than FOUP. The storage system SYS is also applicable to facilities in fields other than that in the semiconductor manufacturing field, and the article 2 may be other articles that can be stored by the storage system SYS.

The storage system SYS includes, as illustrated in FIGS. 1 and 2, an overhead stocker 100, an overhead transport vehicle system 200, and a transport device 300. The overhead stocker 100 includes racks 10 having a plurality of storages 11, a first overhead track 20, and a crane 40. The racks 10 are arranged along the first overhead track 20 on which the crane 40 travels. As illustrated in FIG. 1, the storages 11 provided on the rack 10 are provided on a frame 13 and arranged in three stages vertically (Z direction). The number of stages of the storages 11 can be set arbitrarily. In addition, a plurality of multiple storages 11 are arranged side by side along the traveling direction (Y direction) of the crane 40 which will be described later.

The storages 11 have shelves 11a on which the article 2 is placed. Each shelf 11a is held by the frame 13. In the following description, placing the article 2 on the storage 11 means to place the article 2 on the shelf 11a of the storage 11. On each shelf 11a of the storage 11, a plurality of pins that enter groove portions provided on the bottom face of the article 2 when the article 2 is placed may be provided. As the pins enter into the groove portions of the article 2, the article 2 is positioned with respect to the storage 11 (the shelf 11a).

The rack 10 is suspended from first positions P1 of a grid ceiling GC of a building by first suspending members 3. The grid ceiling GC is in a grid shape in which a plurality of squares are in line in each of the directions orthogonal to each other in the horizontal direction. Above the grid ceiling GC, a downflow unit that supplies downflow in the building from the multiple squares may be arranged.

The lower end of the rack 10 is set to be higher than the height of the upper end of a processing apparatus TL from a floor surface F. The processing apparatus TL performs various processes such as a film-forming process or an etching process on a semiconductor wafer accommodated in the FOUP that is the article 2, for example. The height of the lower end of the crane 40 also, which will be described later, is set to be higher than the height of the upper end of the processing apparatus TL. That is to say, the overhead stocker 100 is arranged above the upper end of the processing apparatus TL. The lower end of the crane 40 is set to a height that allows workers or the like to travel on the floor surface F without hindrance. As a result, a part of the space below the overhead stocker 100 can be used as a worker passage PS.

In the storage 11, by the crane 40, the article 2 is placed, and the article 2 is taken out. In some of the storages 11, by an upper overhead transport vehicle 60 which will be described later, the article 2 is placed, and the article 2 is taken out. The storage 11 to and from which the article 2 is delivered and received by the upper overhead transport vehicle 60 is the storage 11 of the uppermost stage of the rack 10. The vertical dimension of the storage 11 (the size from the upper face of a shelf 11a to the lower face of a shelf 11a of the storage 11 above) is set to a size needed for a transfer device 42 of the crane 40 which will be described later to support and lift the article 2 from the lower face side. The transfer device 42 of the crane 40 employs, for example, a configuration of supporting and lifting the article 2 from the lower face side and thus does not need a large space above the article 2. For example, the vertical dimension of the storage 11 can be set to a size obtained by adding an extent of a few centimeters to the vertical dimension of the article 2.

The first overhead track 20, as illustrated in FIG. 1, is suspended from third positions P3 of the grid ceiling GC by third suspending members 5. The first overhead track 20, as illustrated in FIG. 2, is an annular track having two linear portions 21 and 22 extending in the X direction and connecting portions 23. The connecting portions 23 are provided on the +X side and the −X side of the two linear portions 21 and 22 and connect the linear portion 21 and the linear portion 22. The crane 40 and the upper overhead transport vehicle 60 which will be described later can travel around in one direction (for example, a clockwise direction in planar view) along the linear portions 21 and 22 and the connecting portions 23.

In the first overhead track 20, two circulating tracks composed of two linear portions 21 and 22 and the connecting portions 23 are arranged side by side in the Y direction. The two circulating tracks are connected by a connecting track 24 that connects the connecting portions 23 on the +X side and by a connecting track 24 that connects the connecting portions 23 on the −X side. Accordingly, the crane 40 and the upper overhead transport vehicle 60 which will be described later can, as indicated by arrows in FIG. 2, be moved from the circulating track on the +X side to the circulating track on the −X side via the connecting track 24, and also, be moved from the circulating track on the −X side to the circulating track on the +X side via the connecting track 24.

The above-described racks 10 are provided on the +Y side and the −Y side with respect to the linear portions 21 and 22. That is to say, the racks 10 are, in planar view, arranged on the inner side and the outer side of the first overhead track 20, which is a circulating track on which the crane 40 travels. These racks 10 are arranged above the processing apparatus TL. The space above the processing apparatus TL has conventionally been regarded as a dead space, and by arranging the racks 10 in such a space, the space in the building can be used effectively.

The crane 40, as illustrated in FIG. 1, holds the article 2 and travels along the first overhead track 20 to move. The crane 40 transports the article 2 between the storage 11 and another storage 11. The crane 40 travels around the first overhead track 20. In this configuration, in the circulating tracks on the +Y side and on the −Y side, one each of the crane 40 is arranged and two cranes 40 are arranged in one first overhead track 20, but the number of cranes 40 is not limited to two. For example, one crane 40 may be arranged in one first overhead track 20 or three or more cranes 40 may be arranged. The crane 40, as illustrated in FIG. 1, is suspended from the first overhead track 20.

The crane 40 includes two travelers 41 and a transfer device 42. Below the travelers 41, an upper supporter 47 is fitted via attaching portions 46 and, by the upper supporter 47, the two travelers 41 are coupled. Each traveler 41 includes a traveling driver not depicted and a plurality of wheels 41a and travels along the first overhead track 20. The traveling driver not depicted provided on the traveler 41 may be an electric motor that is provided on the traveler 41 and drives the wheels 41a, or may be a linear motor, for example. In the crane 40 of the first example, the two travelers 41 are provided so that the transfer device 42, which is a heavy object itself, and the article 2 can be reliably supported. The crane 40 is not limited to the configuration provided with two travelers 41 and may include one or three or more travelers 41.

The transfer device 42 includes masts 43, an elevating table 44, lifting drivers 45, a telescopic portion 48, and a placing table 49. The mast 43 is suspended from the upper supporting portion 47 and extends vertically. One mast 43 is provided both at the front and rear in the traveling direction of the traveler 41. The masts 43 are not limited to being a total of two and may be one. The mast 43 is, as in the foregoing, provided so that the height of the lower end of the mast 43 from the floor surface F is higher than the height of the upper end of the processing apparatus TL. For example, the lower end of the mast 43 is the lower end of the crane 40.

The telescopic portion 48 is composed of a plurality of arms that can be expanded and contracted in the direction orthogonal to the traveling direction of the traveler 41. The placing table 49 is provided at the tip of the telescopic portion 48. The placing table 49 is a triangular plate-like member on which the article 2 can be placed. The placing table 49 holds the article 2 placed on the placing table 49 by supporting it from the lower side. On the upper face of the placing table 49, provided are pins that insert into the groove portions provided on the bottom face of the article 2 and position the article 2. On the above-described shelf 11a of the storage 11, provided is a cutout not depicted that allows the placing table 49 to pass therethrough vertically.

The transfer device 42, when receiving the article 2 from the storage 11, locates the placing table 49 below the article 2 by extending the telescopic portion 48 and raises the elevating table 44, thereby scooping up the article 2 with the placing table 49. The transfer device 42 contracts the telescopic portion 48 while the article 2 is still placed on the placing table 49, thereby arranging the placing table 49, on which the article 2 is placed, above the elevating table 44. When delivering the article 2 to the storage 11 by the transfer device 42, it is performed by reversing the above-described operation. The transfer device 42 is not limited to the above-described configuration and may be in other configurations such as a configuration in which a portion of the article 2 (for example, a flange portion 2a provided on the upper portion of FOUP) is held and lifted, for example.

The lifting drivers 45 are hoists, for example, and raise and lower the elevating table 44 along the masts 43. The lifting driver 45 includes a suspending member 45a and a driver not depicted. The suspending member 45a is a wire, a belt, or the like, for example, and the elevating table 44 is suspended from the upper supporter 47 by this suspending member 45a. The driver not depicted included in the lifting driver 45 is provided on the upper supporter 47, for example, and performs feeding and winding of the suspending member 45a. The elevating table 44 is guided by the masts 43 and descends, when the drivers not depicted included in the lifting drivers 45 feed out the suspending members 45a. The elevating table 44 is guided by the masts 43 and ascends when the drivers not depicted included in the lifting drivers 45 wind the suspending members 45a. The lifting drivers 45 are controlled by a control device or the like not depicted and lower or raise the elevating table 44 at a predetermined speed. The lifting drivers 45 are controlled by the control device or the like and hold the elevating table 44 at a target height.

The lifting drivers 45 are provided on the upper supporter 47. The lifting drivers 45 may, in place of being provided on the upper supporter 47, be provided on the elevating table 44, for example. As a configuration in which the lifting drivers 45 are provided on the elevating table 44, it may be a configuration in which the elevating table 44 is raised and lowered by performing winding or feeding a belt, a wire or the like suspended from the upper supporter 47 by hoists mounted on the elevating table 44, for example. It may be a configuration in which an electric motor and the like that drives pinion gears is mounted on the elevating table 44, racks that mesh with the pinion gears are formed on the masts 43, and by rotating the pinion gears by the electric motor and the like, the elevating table 44 is raised or lowered.

The overhead transport vehicle system 200 includes a second overhead track 30 and an overhead transport vehicle 50. The overhead transport vehicle 50 travels along the second overhead track 30 and performs the delivery and reception of the article 2 to and from a load port LP of the processing apparatus TL that is a predetermined transfer destination arranged below the second overhead track 30. The second overhead track 30, as illustrated in FIG. 1, is suspended from second positions P2 of the grid ceiling GC by second suspending members 4.

The second overhead track 30 is, as illustrated in FIG. 2, arranged between an inter-bay route (inter-bay track) R1 and an inter-bay route R2 in planar view. The second overhead track 30 is each provided in the bay (within an intra-bay), and the inter-bay route R1 and the like are provided to connect a plurality of second overhead tracks 30. In this configuration, the bay (intra-bay) refers to a range (area) where, in planar view, the load ports LP of a plurality of processing apparatuses TL are provided facing each other and the worker passage PS is provided between the load ports LP provided to face each other, for example. The second overhead track 30 is connected to the inter-bay route R1 via two branch lines S1 for entry or exit and is connected to the inter-bay route R2 via two branch lines S2 for entry or exit.

The second overhead track 30 has linear portions 31 and connecting portions 32. The overhead transport vehicle 50 travels around in one direction (for example, a clockwise direction in planar view) along the linear portions 31 and the connecting portions 32. The linear portions 31 are arranged in the Y direction along a plurality of load ports LP directly above the load ports LP. The two linear portions 31 are arranged to be in parallel with (parallel to) the connecting track 24 of the first overhead track 20 in planar view. The connecting portions 32 are arranged at both ends of the +Y side and the −Y side by including a curved portion and connect the two linear portions 31 to each other. The second overhead track 30 is arranged below the crane 40 (the masts 43) and the racks 10 of the overhead stocker 100. The overhead transport vehicle 50 that travels this second overhead track 30 travels below the overhead stocker 100.

The overhead transport vehicle 50 enters the second overhead track 30 via the branch lines S1 and S2 from the inter-bay routes R1 and R2 or exits to the inter-bay routes R1 and R2 via the branch lines S1 and S2 from the second overhead track 30. The overhead transport vehicle 50 travels along the second overhead track 30 and, at the linear portion 31, performs the delivery and reception of the article 2 to and from the load port LP of the processing apparatus TL. The overhead transport vehicle 50 performs, at the linear portion 31, the delivery and reception of the article 2 to and from a placement portion 14 (including a delivery/reception port 12) which will be described later. The detail of the configuration of the overhead transport vehicle 50 will be described later.

The linear portions 31 of the second overhead track 30 are provided along and directly above a plurality of load ports LP facing each other with a predetermined interval (the worker passage PS). In this configuration, for the load port LP in one processing apparatus TL, a plurality of articles 2 (in FIG. 2, six articles 2 onto the load port LP) can be placed. However, the number of articles 2 that can be placed on the load port LP is predetermined for each processing apparatus TL. The second overhead track 30 is provided directly above the load ports LP, and thus, the overhead transport vehicle 50 that travels the second overhead track 30 performs the delivery and reception of the article 2 to and from the load port LP by merely raising and lowering the article 2, and with respect to the placement portion 14 (the delivery/reception port 12) which will be described later, performs the delivery and reception of the article 2 by laterally extending (by lateral transfer) a gripper 53. As illustrated in FIG. 2, a part of the first overhead track 20 and a part of the second overhead track 30 are arranged in an overlapped manner in planar view. Thus, the overhead stocker 100 and the overhead transport vehicle system 200 can be arranged compactly in planar view.

Figure 3:
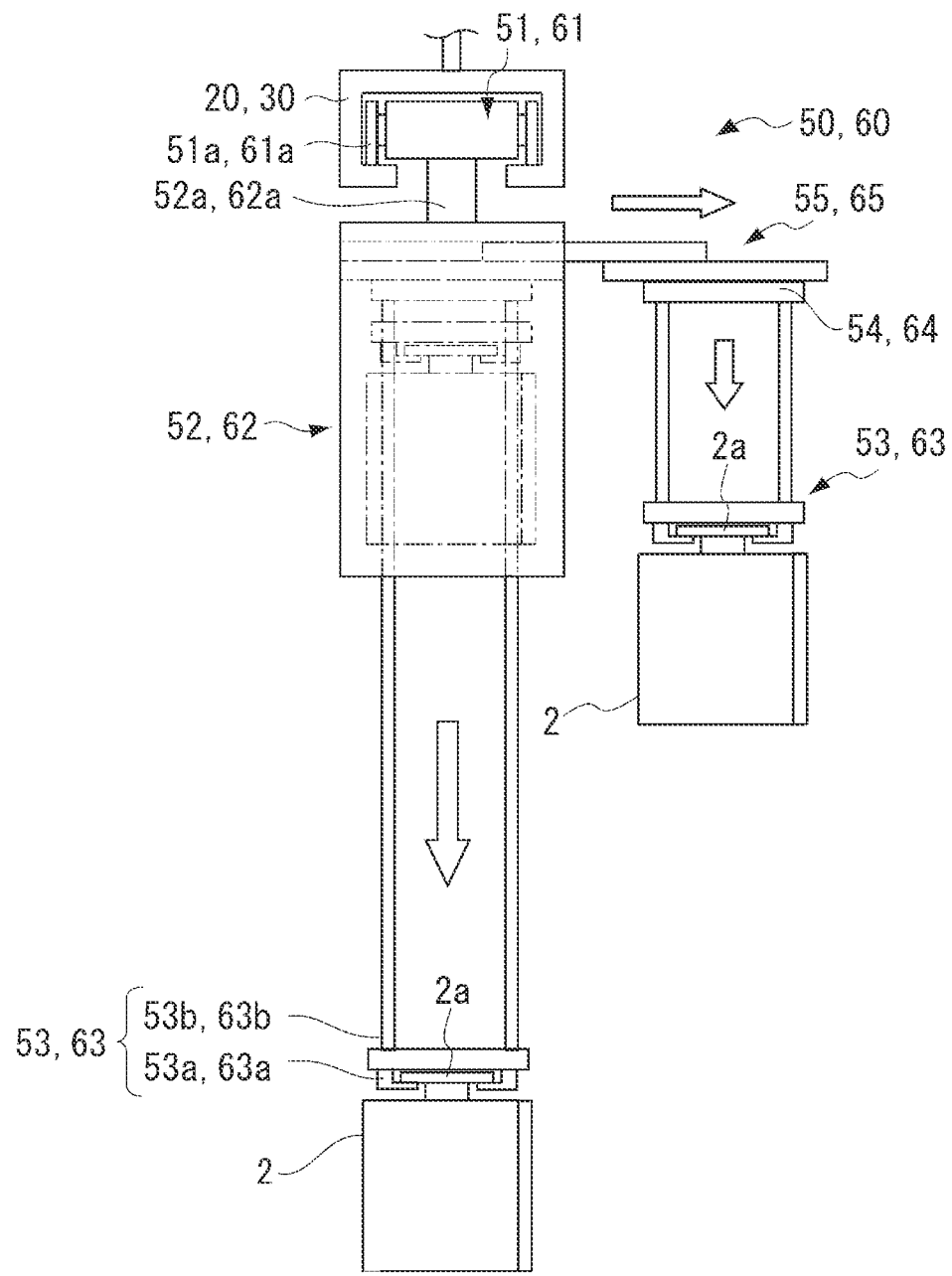
FIG. 3 is a diagram illustrating one example of an overhead transport vehicle and an upper overhead transport vehicle.

FIG. 3 is a diagram illustrating one example of the overhead transport vehicle 50 and the upper overhead transport vehicle 60 which will be described later. The overhead transport vehicle 50 has, as illustrated in FIG. 3, a traveler 51 and a body 52. The traveler 51 includes a traveling driver not depicted and a plurality of wheels 51*a* and travels along the second overhead track 30. The traveling driver not depicted provided on the traveler 51 may be an electric motor provided on the traveler 51 and drives the wheels 51*a*, or may be a linear motor, for example.

The body 52 is fitted to the lower portion of the traveler 51 via an attaching portion 52*a*. The body 52 has the gripper 53 that grips the article 2, a lifting driver 54 that suspends and elevates the gripper 53, and a lateral feeder 55 that moves the lifting driver 54 to the lateral side of the track. The gripper 53 grasps and grips a flange portion 2*a* of the article 2 from above, thereby suspending and holding the article 2. The gripper 53 is, for example, a chuck having a plurality of claw portions 53*a* capable of advancing and retreating in the horizontal direction, and by causing the claw portions 53*a* to enter below the flange portion 2*a* of the article 2 and by raising the gripper 53, suspends and holds the article 2. The gripper 53 is connected to a suspending member 53*b* such as a wire or a belt. The gripper 53 is suspended from the lifting driver 54 via the suspending member 53*b* and is raised and lowered by the lifting driver 54.

The lifting driver 54 is a hoist, for example, and lowers the gripper 53 by feeding out the suspending member 53*b* and raises the gripper 53 by winding the suspending member 53*b*. The lifting driver 54 is controlled by the control device or the like not depicted and lowers or raises the gripper 53 at a predetermined speed. The lifting driver 54 is controlled by the control device or the like not depicted and holds the gripper 53 at a target height.

The lateral feeder 55 has movable plates arranged in an overlapping manner vertically, for example. The movable plates are movable to the lateral side of the traveling direction (a direction orthogonal to the traveling direction, lateral direction) of the traveler 51. On the movable plate, the lifting driver 54 is fitted. The body 52 has a guide not depicted to guide the lateral feeder 55, a driver not depicted to drive the lateral feeder 55, and the like. The lateral feeder 55 moves, by a driving force from the driver such as an electric motor, the lifting driver 54 and the gripper 53 between a protruding position and a storage position. The protruding position is a position where the gripper 53 protrudes to the lateral side from the body 52. The storage position is a position where the gripper 53 is stored in the body 52. A rotator to rotate the lifting driver 54 or the gripper 53 around a shaft vertically may be provided.

The overhead transport vehicle 50 raises and lowers the gripper 53 (the article 2) by the lifting driver 54 as in the foregoing, thereby performing the delivery and reception of the article 2 to and from the load port LP. The overhead transport vehicle 50 can, by moving the lifting driver 54 (the gripper 53) above any of a plurality of placement portions 14 (including the delivery/reception port 12) by the lateral feeder 55, and by raising and lowering the gripper 53 (the article 2) by the lifting driver 54, deliver and receive the article 2 to and from the relevant placement portion 14.

The transport device 300 transports the article 2 vertically between the overhead stocker 100 and the overhead transport vehicle system 200. In this configuration, the transport device 300 is the upper overhead transport vehicle 60. The storage system SYS includes the delivery/reception port 12 to deliver and receive articles between the overhead transport vehicle system 200 and the transport device 300 (the upper overhead transport vehicle 60). The delivery/reception port 12 is a part of the placement portion 14 on which the article 2 can be placed. The placement portion 14 including the delivery/reception port 12 is, as illustrated in FIG. 1, suspended from fourth positions P4 of the grid ceiling GC by fourth suspending members 6.

The placement portion 14 is, in planar view, arranged on the inner side of the second overhead track 30, which is a circulating track and provided linearly along the Y direction. On the placement portion 14, the articles 2 can be placed side by side in two rows. A part of the placement portion 14 is the delivery/reception port 12. The portion of the placement portion 14 excluding the delivery/reception port 12 is a buffer on which the articles 2 can be placed and that the delivery and reception of the articles 2 can be performed by the overhead transport vehicle 50.

On the delivery/reception port 12, a plurality of articles 2 can be placed. The delivery/reception ports 12 are arranged directly below the connecting track 24 in the first overhead track 20 that the upper overhead transport vehicle 60 travels (in FIG. 2, the delivery/reception port 12 on the +X side row), and in the lateral direction and below with respect to the connecting track 24 (in FIG. 2, the delivery/reception port 12 on the −X side row). The delivery/reception port 12 is arranged in the lateral direction and below with respect to the second overhead track 30. Accordingly, the overhead transport vehicle 50 can, to and from the delivery/reception port 12 on the +X side row in FIG. 2, deliver and receive the article 2 by lateral transfer from the linear portion 31 of the +X side. The overhead transport vehicle 50 can, to and from the delivery/reception port 12 on the −X side row in FIG. 2, deliver and receive the article 2 by lateral transfer from the linear portion 31 of the −X side.

The upper overhead transport vehicle 60 transports the article 2 vertically between the overhead stocker 100 and the delivery/reception port 12 (a part of the placement portion 14). The upper overhead transport vehicle 60 has, as illustrated in FIG. 3, a second traveler 61 and a second body 62. The second traveler 61 employs the same configuration as that of the traveler 41 of the crane 40, includes a traveling driver not depicted and a plurality of wheels 61a, and travels along the first overhead track 20. The second body 62 is fitted to the lower portion of the second traveler 61 via an attaching portion 62a. The second body 62 has a second gripper 63 (including claw portions 63a and suspending members 63b) that holds the article 2, a second lifting driver 64 that suspends and elevates the second gripper 63, and a second lateral feeder 65 that moves the second lifting driver 64 to the lateral side of the track.

These second traveler 61, the second body 62, the second gripper 63, the second lifting driver 64, and the second lateral feeder 65 employ, as illustrated in FIG. 3, the same configurations as those of the above-described traveler 51, the body 52, the gripper 53, the lifting driver 54, and the lateral feeder 55 of the overhead transport vehicle 50. Thus, for the upper overhead transport vehicle 60, the overhead transport vehicle 50 of the overhead transport vehicle system 200 can be applied as is. The upper overhead transport vehicle 60 travels the first overhead track 20 so that there is no need to provide a separate track, and the manufacturing cost of the storage system SYS can be reduced.

The upper overhead transport vehicle 60 can, by raising and lowering the second gripper 63 (the article 2) by the second lifting driver 64, deliver and receive the article 2 to and from the delivery/reception port 12 that is directly below the connecting track 24. With the delivery/reception port 12 that is in the lateral direction and below with respect to the connecting track 24 (the delivery/reception port 12 on the −X side row in FIG. 2), the upper overhead transport vehicle 60 can, by moving the second lifting driver 64 above the delivery/reception port 12 by the second lateral feeder 65, and by raising and lowering the second gripper 63 (the article 2) by the second lifting driver 64, deliver and receive the article 2 to and from the relevant delivery/reception port 12.

The upper overhead transport vehicle 60 can, by moving the second lifting driver 64 above at least one storage 11 of the storages 11 by the second lateral feeder 65, and by raising and lowering the second gripper 63 (the article 2) by the second lifting driver 64, deliver and receive the article 2 to and from the storage 11 located below the second lifting driver 64. In this configuration, the upper overhead transport vehicle 60 can deliver and receive the article 2 to and from the storage 11 of the uppermost stage of the rack 10. The storage 11 of a delivery/reception target by the upper overhead transport vehicle 60 may be the storage 11 other than that of the uppermost stage. The transport device 300 is not limited to the upper overhead transport vehicle 60 and may be other devices such as a conveyor device that can transport the article 2 between the storage 11 and the delivery/reception port 12, for example.

In this configuration, a part of the rack 10 and the load port LP of the processing apparatus TL that is a predetermined transfer destination are overlapped in planar view. Accordingly, the racks 10 can be expanded in the horizontal direction up to above the load port LP, and many articles 2 can be stored. The racks 10 are provided above the overhead transport vehicle system 200. That is to say, the racks 10 can be provided regardless of the arrangement of the second overhead track 30 of the overhead transport vehicle system 200, and thus, the degree of freedom in the arrangement of the racks 10 is high, and the arrangement of the racks 10 having a favorable storage efficiency of the articles 2 can be easily achieved.

The storage system SYS has the control device not depicted. This control device not depicted integrally controls the storage system SYS. The control device not depicted controls operations of the crane 40, the overhead transport vehicle 50, and the upper overhead transport vehicle 60 by wireless or wired communication. The control device not depicted may be divided into a control device to control the crane 40, a control device to control the overhead transport vehicle 50, and a control device to control the upper overhead transport vehicle 60.

When transporting the article 2 from the storage 11 to the load port LP in the storage system SYS, the control device not depicted controls the upper overhead transport vehicle 60 (the transport device 300) and directs it to receive the article 2 of the transportation target from the storage 11 of the uppermost stage and deliver the article 2 to the designated delivery/reception port 12. When the article 2 of the transportation target is in the storage 11 other than the uppermost stage, the crane 40 of the overhead stocker 100 transfers the article 2 of the transportation target to the storage 11 of the uppermost stage of the rack 10.

Subsequently, the upper overhead transport vehicle 60 travels along the first overhead track 20, stops at the lateral side of the storage 11 on which the article 2 of the transportation target is placed, lowers the second gripper 63 by the second lifting driver 64 after protruding the second lateral feeder 65, and grips the article 2 by the second gripper 63. Then, the upper overhead transport vehicle 60 raises the second gripper 63 by the second lifting driver 64, and then, by contracting the second lateral feeder 65, returns the second gripper 63 into the storage position, thereby accommodating the article 2 in the second body 62.

Subsequently, the upper overhead transport vehicle 60 travels along the first overhead track 20, holding the article 2 by the second gripper 63, and stops directly above the designated delivery/reception port 12. The upper overhead transport vehicle 60 then lowers the second gripper 63 and the article 2 by driving the second lifting driver 64 and releases the gripping of the second gripper 63 after placing the article 2 on the delivery/reception port 12, thereby delivering the article 2 to the delivery/reception port 12.

Next, the control device not depicted controls the overhead transport vehicle 50 of the overhead transport vehicle system 200 and directs it to receive the article 2 from the delivery/reception port 12 and deliver the article 2 to the designated load port LP. The overhead transport vehicle 50 travels along the second overhead track 30, stops at the lateral side of the delivery/reception port 12 on which the article 2 is placed, lowers the gripper 53 by the lifting driver 54 after protruding the lateral feeder 55, and grips the article 2 by the gripper 53. Thereafter, the overhead transport vehicle 50 raises the gripper 53 by the lifting driver 54, and then, by contracting the lateral feeder 55, returns the gripper 53 into the storage position, thereby accommodating the article 2 in the body 52.

Subsequently, the overhead transport vehicle 50 travels along the second overhead track 30, holding the article 2 by the gripper 53, and stops directly above the designated load port LP. Then, the overhead transport vehicle 50 lowers the gripper 53 and the article 2 by driving the lifting driver 54 and releases the gripping of the gripper 53 after placing the article 2 on the load port LP, thereby delivering the article 2 to the load port LP. By the above-described series of operations, the article 2 is transported from the storage 11 to the load port LP.

When transporting the article 2 from the load port LP of the processing apparatus TL to the storage 11 of the overhead stocker 100, by performing reverse operation of the above-described series of operations, the article 2 is transported from the load port LP of the processing apparatus TL to the storage 11 of the overhead stocker 100 via the delivery/reception port 12. The same applies even when the transfer destination of the article 2 is other than the load port LP, and the same applies even when receiving the article 2 from other than the load port LP.

Figure 4:
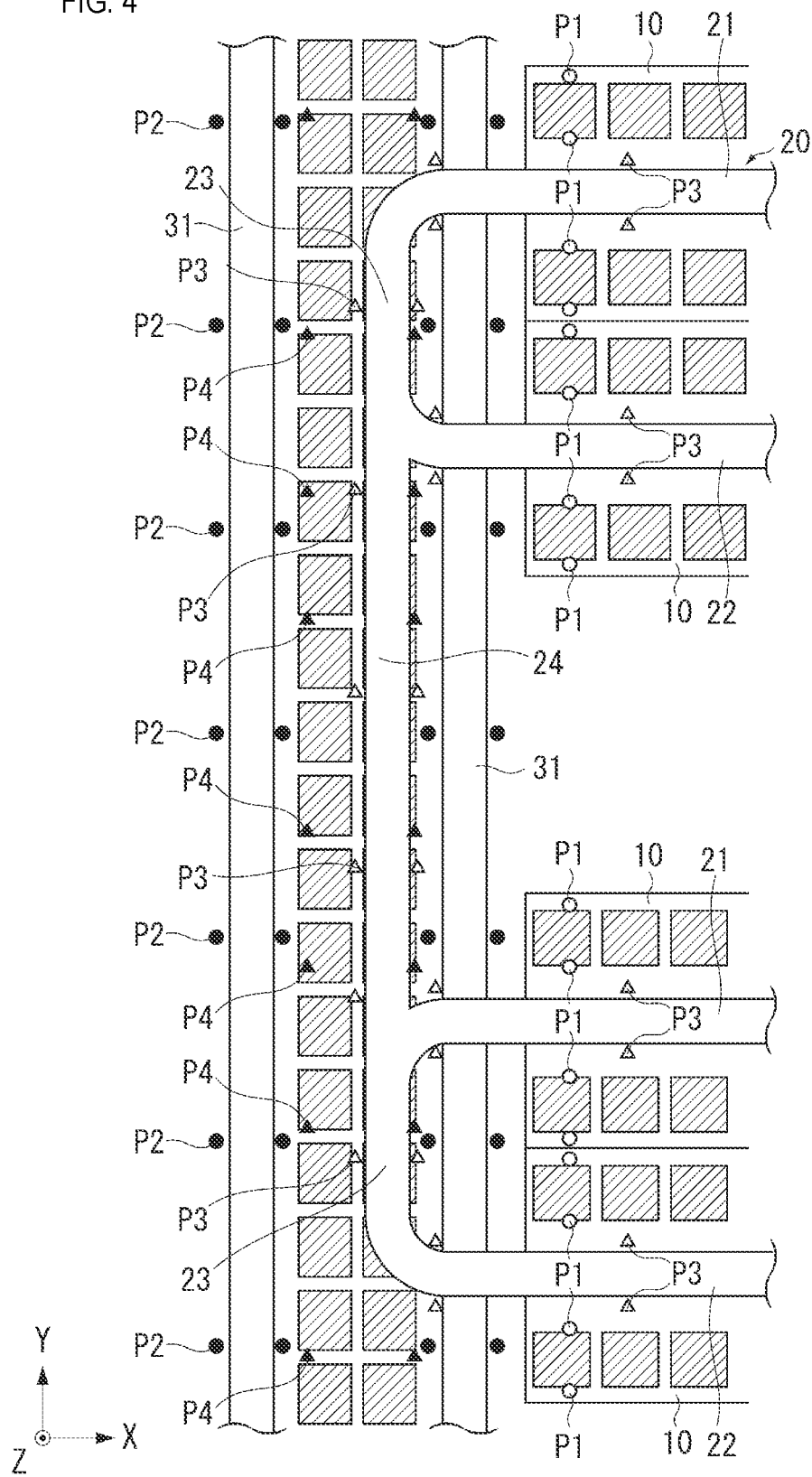
FIG. 4 is a plan view illustrating one example of suspending positions in a grid ceiling by enlarging a part of FIG. 2.

FIG. 4 is a plan view illustrating a part of FIG. 2 in an enlarged manner and is a diagram illustrating one example of suspending positions in the grid ceiling GC. In FIG. 4, indicated is the positional relation among the first position P1 where the first suspending member 3 to suspend the rack 10 is arranged, the second position P2 where the second suspending member 4 to suspend the second overhead track 30 is arranged, the third position P3 where the third suspending member 5 to suspend the first overhead track 20 is arranged, and the fourth position P4 where the fourth suspending member 6 to suspend the delivery/reception port 12 is arranged. In FIG. 1, the first suspending members 3, the second suspending members 4, the third suspending members 5, and the fourth suspending members 6 are schematically illustrated and are different from their respective suspending positions illustrated in FIG. 4.

In FIG. 4, the first position P1 is indicated by a white circle. As illustrated in FIG. 4, a plurality of first positions P1 are set to positions to overlap the racks 10 in planar view. The first positions P1 are set side by side at intervals in the Y direction, in the vicinity of the end portion in the X direction in each rack 10. The rack 10 is provided with the storages 11, and it is also assumed that the articles 2 are placed on all the storages 11. Thus, the first positions P1 are set by being dispersed so that the grid ceiling GC can withstand an assumed maximum load of the rack 10. In this configuration, in planar view, the first positions P1 are set to sandwich in the Y direction the article 2 that is placed on the −X side of the rack 10. On the +X side of the rack 10 also, the first positions P1 are set in the same manner.

In FIG. 4, the second position P2 is indicated by a black circle. A plurality of second positions P2 are set along the linear portions 31 of the second overhead track 30 in planar view. The second positions P2 are set side by side at intervals in the Y direction, at positions deviated from the second overhead track 30 to the lateral side of the traveling direction in planar view. Each second position P2 is set on both sides of the X direction with respect to the linear portion 31. Because the overhead transport vehicle 50 travels on the second overhead track 30, a plurality of overhead transport vehicles 50 travel side by side and the like is also assumed. The second positions P2 are set by being dispersed so that the grid ceiling GC can withstand an assumed maximum load of the second overhead track 30. The second positions P2 are set at a regular interval in the Y direction, but the example is not limited to this form, and the intervals in the Y direction may differ in some parts. On the connecting portions 32 of the second overhead track 30 also, the multiple second positions P2 are set in the same manner.

In FIG. 4, the third position P3 is indicated by a white triangle. A plurality of third positions P3 are set along the linear portions 21 and 22, the connecting portions 23, and the connecting tracks 24 of the first overhead track 20 in planar view. The third positions P3 are set side by side at intervals in the traveling direction, at positions deviated from the first overhead track 20 to the lateral side of the traveling direction in planar view. Each third position P3 is set on both sides of the linear portions 21 and 22, the connecting portions 23, and the connecting tracks 24. Because the crane 40 and the upper overhead transport vehicle 60 travel on the first overhead track 20, the crane 40 and the upper overhead transport vehicles 60 come close to each other and the like is also assumed. The third positions P3 are set by being dispersed so that the grid ceiling GC can withstand an assumed maximum load of the first overhead track 20.

In FIG. 4, the fourth position P4 is indicated by a black triangle. A plurality of fourth positions P4 are set at positions to overlap the placement portion 14 (see FIG. 2) in planar view. In FIG. 4, the depiction of the placement portion 14 is omitted. The fourth positions P4 are set side by side at intervals in the Y direction. Because a plurality of articles are placed on the placement portion 14 (including the delivery/reception port 12), the most articles 2 are placed is also assumed. The fourth positions P4 are set by being dispersed so that the grid ceiling GC can withstand an assumed maximum load of the placement portion 14. The fourth positions P4 are set at a regular interval in the Y direction, but the example is not limited to this form, and the intervals in the Y direction may differ in some parts.

On the lower face side of the grid ceiling GC, beam portions 70 (see FIGS. 5, 6 and others) extending in the X direction or the Y direction are fixed. The beam portion 70 is a rod-like metal member, for example. The length of the beam portion 70 can be set arbitrarily. The beam portions 70 are fixed to the grid ceiling GC by, for example, a fixing member or the like such as a bolt and the like, at each portion where the grid ceiling GC and the beam portions 70 overlap in planar view. Alternatively, the beam portions 70 are suspended from the grid ceiling GC by suspending members. The beam portions 70 may be removable from the grid ceiling GC or may be fixed firmly by welding and the like. The beam portions 70 allow, on the inner side of the squares G in the grid ceiling GC, the first positions P1, the second positions P2, the third positions P3, and the fourth positions P4 to be set.

Each of the first suspending members 3, the second suspending members 4, the third suspending members 5, and the fourth suspending members 6 is suspended from the beam portion 70. That is to say, each of the first positions P1, the second positions P2, the third positions P3, and the fourth positions P4 is set at a position overlapping the beam portion 70 in planar view.

Figure 5:
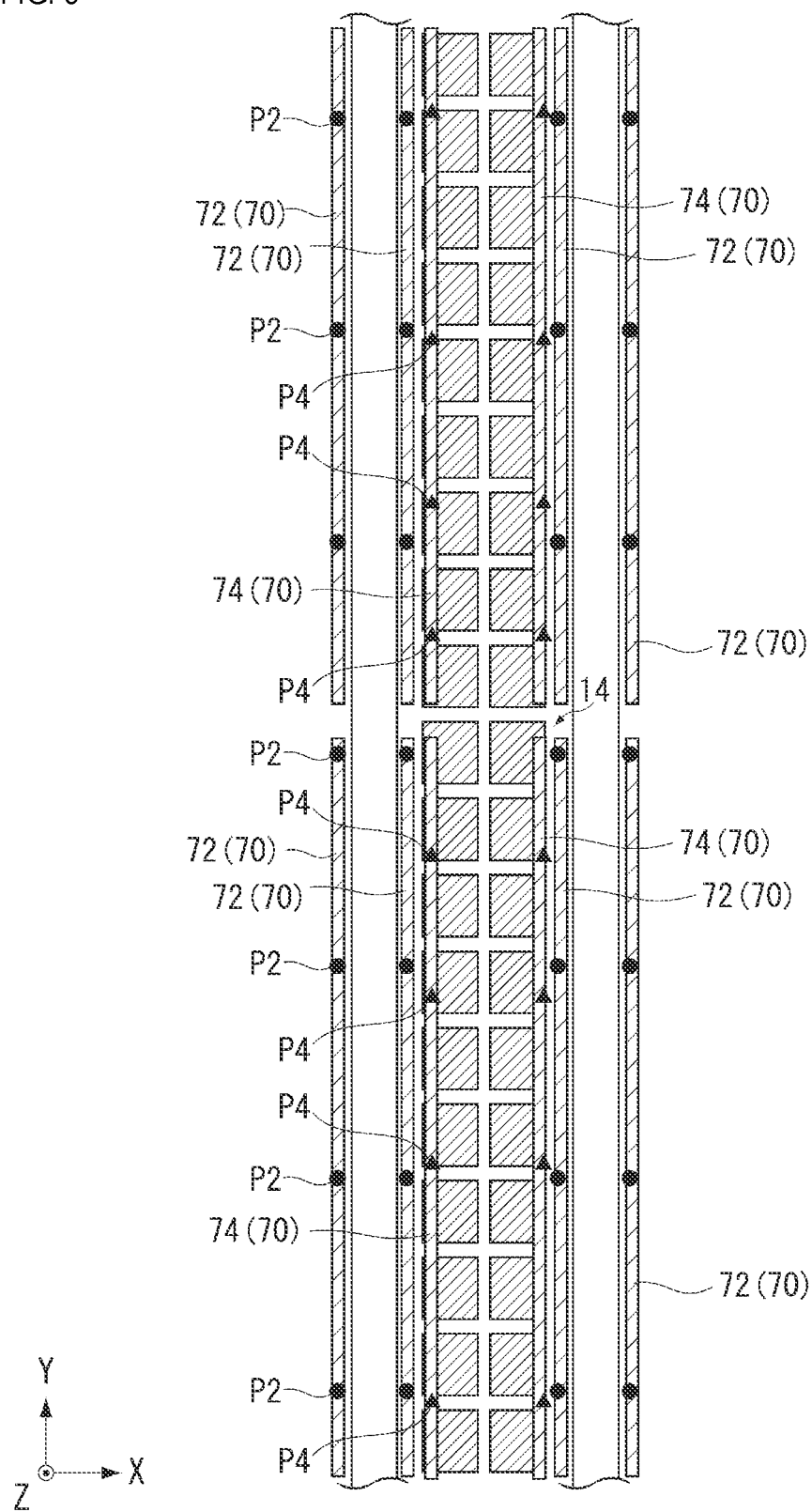
FIG. 5 is a diagram illustrating one example of positions of hanging fittings in a second overhead track.

FIG. 5 is a diagram illustrating the second positions P2 and the fourth positions P4 relating to the suspending positions of the second overhead track 30 and the placement portion 14. In FIG. 5, the depiction of the placement portion 14 is omitted. As illustrated in FIG. 5, the beam portions 70 include second beam portions 72 extending in the Y direction along the linear portions 31 of the second overhead track 30. The beam portions 70 include fourth beam portions 74 extending in the Y direction along the longitudinal direction of the placement portion 14 (longitudinal direction of the delivery/reception port 12). The second position P2 is set at intervals along the second beam portion 72 in planar view. The fourth position P4 is set at intervals along the fourth beam portion 74 in planar view.

Figure 6:
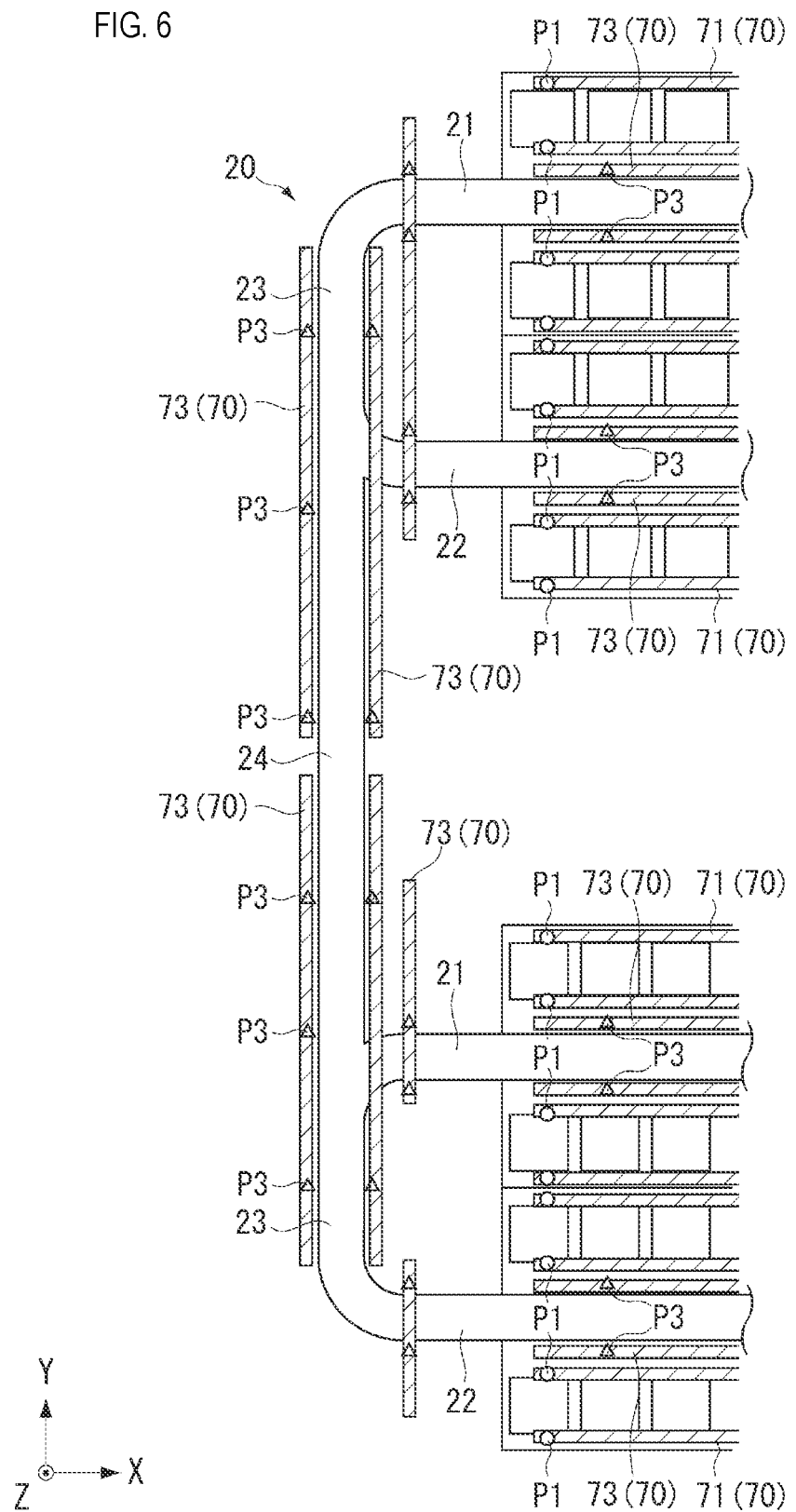
FIG. 6 is a diagram illustrating the positions of shelves and the positions of hanging fittings in a first overhead track.

FIG. 6 is a diagram illustrating the first positions P1 and the third positions P3 relating to the suspending positions of the racks 10 and the first overhead track 20. As illustrated in FIG. 6, the beam portions 70 include first beam portions 71 extending along the X direction that is the direction of the articles 2 lined up on the racks 10. The beam portions 70 have third beam portions 73 extending in the Y direction along the connecting portions 23 and the connecting tracks 24 of the first overhead track 20 and third beam portions 73 extending in the X direction along the linear portions 21 and 22. The first position P1 is set at intervals along the first beam portion 71 in planar view. The third position P3 is set at intervals along the third beam portion 73 in planar view.

Figure 7:
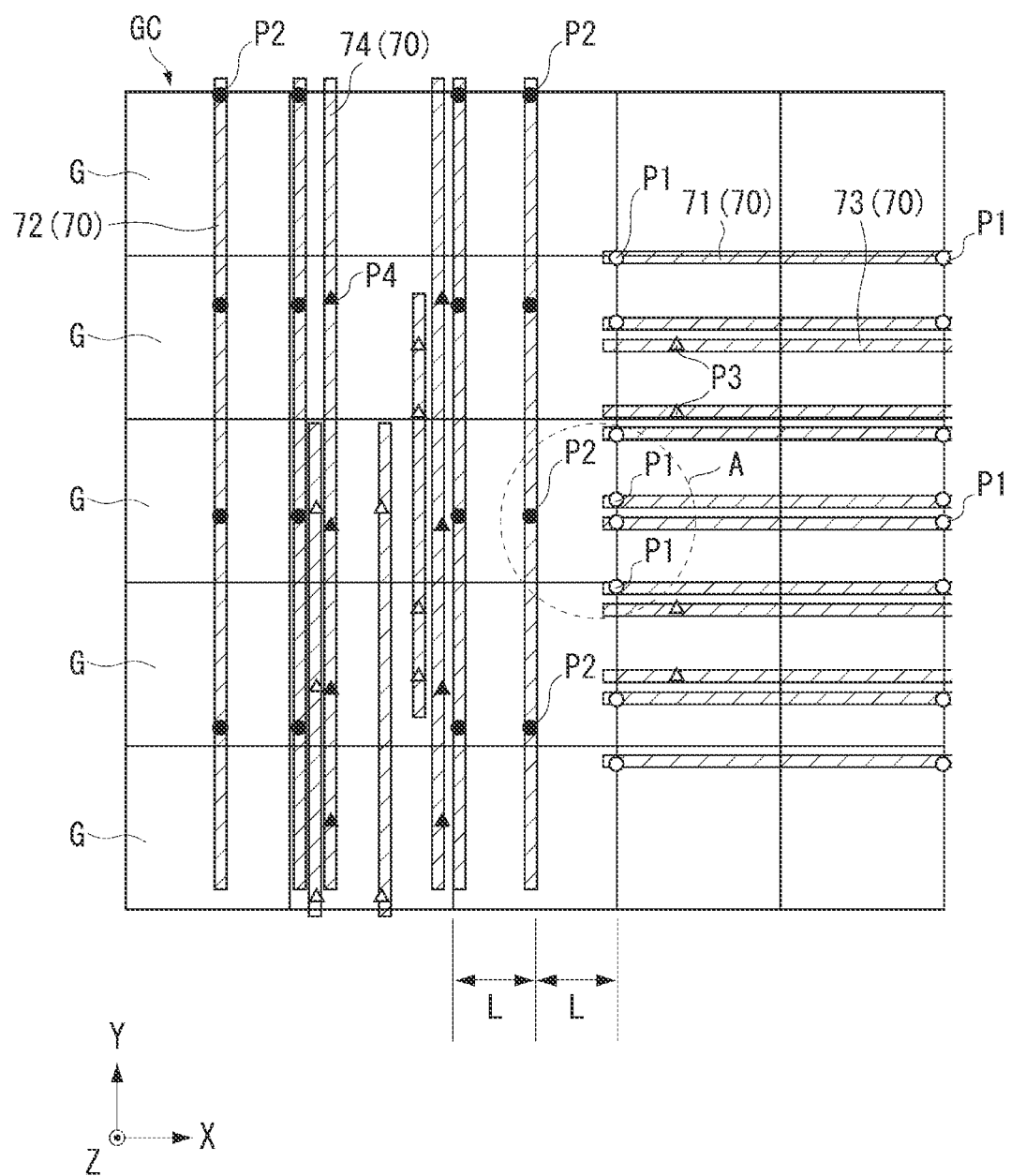
FIG. 7 is a diagram illustrating one example of a positional relation among beam portions and the grid ceiling.

FIG. 7 is a diagram illustrating one example of the positional relation among the beam portions 70 and the grid ceiling GC. In FIG. 7, the grid ceiling GC is illustrated in a grid pattern by straight lines. As illustrated in FIG. 7, the grid ceiling GC has a plurality of squares G lined up along the X direction and the Y direction. Each of the first beam portions 71, the second beam portions 72, the third beam portions 73, and the fourth beam portions 74 is arranged in the X direction or the Y direction along the squares G of the grid ceiling GC, for example. The beam portions 70 are not limited to be arranged in the X direction or the Y direction and may be in a form of being fixed at an inclination of a predetermined angle with respect to the X direction or the Y direction, for example.

As illustrated in FIG. 7, there is a form in which one of the first positions P1 and one of the third positions P3 are set to fall within one square G. That is to say, the first position P1 that is a suspending position of the rack 10 for which the proportion in the weight of the overhead stocker 100 is large and the third position P3 that is a suspending position of the first overhead track 20 for which the proportion in the weight of the overhead stocker 100 is small are set to fall within one square G. By setting the first position P1 and the third position P3 in the same square G, the first suspending member 3 and the third suspending member 5 are arranged to be close to each other. As a result, in the installation or the maintenance of the first suspending member 3 and the third suspending member 5, working at the same place is allowed, and thus the workability can be improved.

As illustrated in FIG. 7, a predetermined distance L that is half the length of one side (X direction or Y direction) of one square G is an index in setting the first position P1 and the second position P2 to be apart. This predetermined distance L is a distance that is set so that the magnitude of the load per unit area in the grid ceiling GC does not exceed a predetermined value (withstanding load). The unit area corresponds to the area of one square G in planar view, for example. The first position P1 and the second position P2 are set to be apart by at least the predetermined distance L (separated by the predetermined distance L or more). As illustrated in FIG. 7, the first positions P1 and the second position P2 are set to different squares G. In FIG. 7, when there is a suspending position on the line indicating the grid ceiling GC, it is included in either one of the squares G on both sides sectioned by the relevant straight line. Thus, in FIG. 7, when the first position P1 is present on the line of one square G including the second position P2, the first position P1 and the second position P2 are each set to a different square G.

For example, when the second position P2 is arranged near the center of the square G, by setting the first position P1 to the square G that is different from that of the second position P2, the first position P1 and the second position P2 can be set apart at least by the predetermined distance L. As a result, setting both the first position P1 and the second position P2 exceeding a predetermined value (withstanding load) set in advance in each square G of the grid ceiling GC can be avoided.

Figure 8:
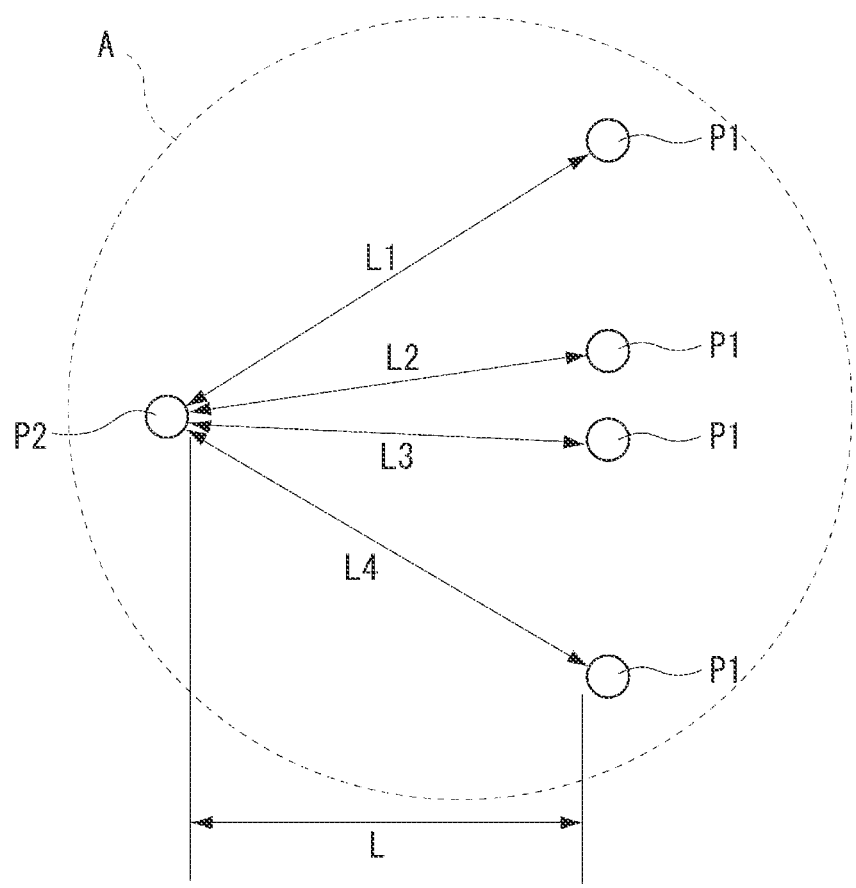
FIG. 8 is a diagram illustrating one example of distances among first positions and a second position.

FIG. 8 is a diagram illustrating one example of a positional relation among the first positions P1 and the second position P2. FIG. 8 is an enlarged diagram of the positional relation among the first positions P1 and the second position P2 in the area A in FIG. 7. The second position P2 in the area A is set near the center of the square G (see FIG. 7). As illustrated in FIG. 8, four first positions P1 are each set apart, with respect to the second position P2, by the distances L1, L2, L3, and L4. These distances L1, L2, L3, and L4 are longer than the above-described predetermined distance L. That is to say, each of the first suspending members 3 suspending the rack 10 that is a heavy object, and the second suspending member 4 suspending the second overhead track 30 that is also a heavy object are arranged apart at least by the predetermined distance L.

The distances L1, L2, L3, and L4 are distances that are set so that the magnitude of the load per unit area (one square G) in the grid ceiling GC does not exceed the predetermined value (withstanding load). In the configuration in which the unit area is one square G, the unit area in the grid ceiling GC can be recognized easily by the square G, and by referring to this square G, the distance between the first position P1 and the second position P2 (for example, the distances L1, L2, L3, and L4) can be set easily. The above-described unit area is not limited to the area of one square G and may be other settings such as an area set by a plurality of squares G and the like, for example.

In this configuration, in planar view, the rack 10 is provided in an area including directly above the processing apparatus TL. Thus, by arranging the rack 10 directly above the processing apparatus TL where the second overhead track 30 is not arranged, the first positions P1 where the rack 10 is suspended and the second positions P2 where the second overhead track 30 is suspended can be easily made apart and dispersed.

Figure 9:
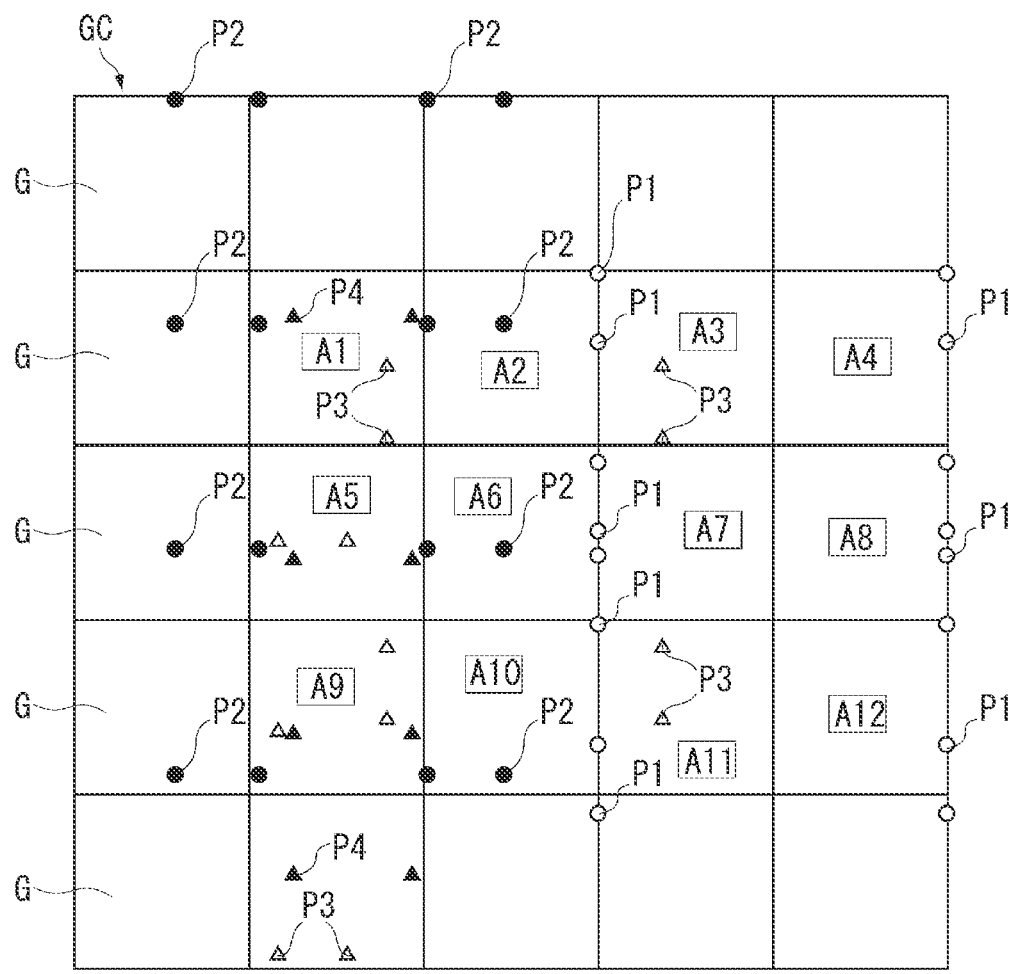
FIG. 9 is a diagram illustrating a load per one square of the grid ceiling.

FIG. 9 is a diagram illustrating a load per one square G of the grid ceiling GC. The data illustrated in FIG. 9 is acquired by simulation and the like, for example. In this simulation, a load V1 applied to the first position P1, a load V2 applied to the second position P2, a load V3 applied to the third position P3, and a load V4 applied to the fourth position P4 are obtained in advance by experiments and the like. Of the loads V1 to V4, the loads V1 and V2 have been confirmed that the values thereof are large. In FIG. 9, of the grid ceiling GC, each total load has been obtained, for example, in 12 squares G (unit area).

As illustrated in FIG. 9, in the 12 squares G, the total load of each is obtained as A1 to A12. The total loads A1 to A12 are, in each square G, the total values of the above-described load V1, the load V2, the load V3, and the load V4. For example, the total load A1 is the total value of one load V2, two loads V3, and two loads V4. The total load A2 is the total value of two loads V2. The total load A3 is the total value of two loads V1 and two loads V3. The details of the total loads A4 to A12 are omitted. As illustrated in FIG. 9, we confirmed in the simulation that, because the loads V1 and V2 having a large load are set in different squares G, the total loads A1 to A12 are smaller than a withstanding load VA in one square G.

As just described, according to the storage system SYS in this configuration, because the first suspending members 3 suspending the rack 10 and the second suspending member 4 suspending the second overhead track 30 are set apart by the distances L1, L2, L3, and L4, the first positions P1 that are suspending positions of the rack 10 that occupies a large proportion in the weight of the overhead stocker 100 and the second positions P2 that are the suspending positions of the second overhead track 30 that occupies a large proportion in the weight of the overhead transport vehicle system 200 can be avoided to be close to each other, and the suspending positions of the rack 10 and the suspending positions of the second overhead track 30 can be dispersed. As a result, it is possible to avoid a large load to be applied to a part of the grid ceiling GC and, as there is no need for large-scale additional work such as reinforcement of the grid ceiling GC and the like, to prevent the installation cost from increasing.

As in the foregoing, the examples have been described, but this disclosure is not limited to the foregoing description, and various modifications are possible within a scope not departing from the gist of the appended claims. For example, in the above-described examples, in the storage systems SYS, a configuration in which the first overhead track 20 and the second overhead track 30 are not connected has been described as an example, but the example is not limited to this configuration. For example, the first overhead track 20 and the second overhead track 30 may be connected via a connecting track and the like.

One or more of the prerequisites described in the above-described examples and the like may be omitted. The prerequisites described in the above-described examples and the like can be combined as appropriate. The disclosure of Japanese Patent Application No. 2019-011281 and all the documents cited in the above-described examples and the like will be incorporated by reference herein.

The invention claimed is:

1. A storage system comprising:
   an overhead stocker including a first overhead track, a rack including a plurality of storages arranged vertically, and a crane that travels along the first overhead track and delivers and receives an article to and from the storages; and
   an overhead transport vehicle system that includes a second overhead track provided below a lower end of the overhead stocker, and an overhead transport vehicle that travels along the second overhead track and delivers and receives the article to and from a predetermined transfer destination, wherein
   the overhead transport vehicle system is arranged so that at least a part of the overhead transport vehicle system overlaps with the overhead stocker in planar view,
   the rack is suspended from a first position of a ceiling by a first suspending member attached to the ceiling,
   the second overhead track is suspended from a second position of the ceiling by a second suspending member attached to the ceiling,
   the first position and the second position are set apart by at least a predetermined distance,
   the ceiling is a grid ceiling in which a plurality of squares are in line in each of directions orthogonal in a horizontal direction, and
   the unit area is an area of one square.

2. The storage system according to claim 1, wherein the predetermined distance is a distance that is set so that magnitude of a load per unit area in the ceiling does not exceed a predetermined value.

3. The storage system according to claim 1, wherein the first position and the second position are set to the squares different from each other in the grid ceiling.

4. The storage system according to claim 1, wherein
   the first overhead track is suspended from a third position of the ceiling by a third suspending member attached to the ceiling, and one of a plurality of first positions and one of a plurality of third positions are set to one square in the grid ceiling.

5. The storage system according to claim 1, wherein a part of the first overhead track and a part of the second overhead track are arranged in an overlapping manner in planar view.

6. The storage system according to claim 1, wherein the rack is, in planar view, provided in an area including directly above a processing apparatus that has the predetermined transfer destination.

7. The storage system according to claim 3, wherein
the first overhead track is suspended from a third position of the ceiling by a third suspending member attached to the ceiling, and
one of a plurality of first positions and one of a plurality of third positions are set to one square in the grid ceiling.

\* \* \* \* \*